US006010924A

United States Patent [19]
Takemura et al.

[11] Patent Number: 6,010,924
[45] Date of Patent: Jan. 4, 2000

[54] PROCESS FOR FABRICATING A THIN FILM TRANSISTOR

[75] Inventors: Yasuhiko Takemura; Hiroki Adachi, both of Kanagawa, Japan

[73] Assignee: Semiconductor Energy Laboratory Co., Ltd., Kanagawa-ken, Japan

[21] Appl. No.: 08/853,187

[22] Filed: Apr. 29, 1997

Related U.S. Application Data

[62] Division of application No. 08/671,499, Jun. 27, 1996, Pat. No. 5,661,311, which is a division of application No. 08/287,259, Aug. 8, 1994, Pat. No. 5,569,935.

[30] Foreign Application Priority Data

Aug. 20, 1993 [JP] Japan .................................. 5-227893

[51] Int. Cl.[7] .......................... H01L 21/336; H01L 21/31; H01L 21/84
[52] U.S. Cl. ............................................ 438/164; 438/439
[58] Field of Search .................................... 438/164, 166, 438/486, 487, 444, 439, 447

[56] References Cited

U.S. PATENT DOCUMENTS

| | | |
|---|---|---|
| 4,277,883 | 7/1981 | Kaplan . |
| 4,425,700 | 1/1984 | Sasaki et al. ............................ 257/354 |
| 4,523,963 | 6/1985 | Ohta et al. . |
| 4,649,626 | 3/1987 | Leong . |
| 5,130,264 | 7/1992 | Troxell et al. . |
| 5,212,397 | 5/1993 | See et al. ................................ 257/354 |
| 5,275,851 | 1/1994 | Fonash et al. . |
| 5,346,839 | 9/1994 | Sundaresan . |
| 5,403,772 | 4/1995 | Zhang et al. . |
| 5,488,001 | 1/1996 | Brotherton . |
| 5,726,082 | 3/1998 | Park et al. ............................... 438/165 |
| 5,773,330 | 6/1998 | Park ........................................ 438/164 |

FOREIGN PATENT DOCUMENTS

| | | |
|---|---|---|
| 57-208124 | 12/1982 | Japan . |
| 61-251166 | 11/1986 | Japan . |
| 62-145775 | 6/1987 | Japan . |
| 62-219961 | 9/1987 | Japan . |
| 63-058875 | 3/1988 | Japan . |
| 63-110667 | 5/1988 | Japan . |
| 2-014579 | 1/1990 | Japan . |
| 2-140915 | 5/1990 | Japan . |
| 3-203378 | 9/1991 | Japan . |

OTHER PUBLICATIONS

"Ultra LSI Process Data Hand Book", Science Forum Co., Apr. 15, 1982, pp. 124–131.
Ito et al., "Thin Film Technique for VLSI" Maruzen Co., Sep. 30, 1986, pp. 19–20.

*Primary Examiner*—Mary Wilczewski
*Attorney, Agent, or Firm*—Sixbey, Friedman, Leedom & Ferguson, PC; Eric J. Robinson

[57] ABSTRACT

A semiconductor device comprising at least two thin film transistors on a substrate having an insulating surface thereon, provided that the thin film transistors are isolated by oxidizing the outer periphery of the active layer of each of the thin film transistors to the bottom to provide an oxide insulating film.

10 Claims, 6 Drawing Sheets

PROCESS FOR FABRICATING A THIN FILM TRANSISTOR

This is a Divisional application of Ser. No. 08/671,499, filed Jun. 27, 1996, now U.S. Pat. No. 5,661,311, which itself is a Divisional Application of Ser. No. 08/287,259, filed Aug. 8, 1994 (now U.S. Pat. No. 5,569,935).

BACKGROUND OF THE INVENTION

1. Field of the Invention

The present invention relates to a structure of a semiconductor integrated circuit comprising at least two thin film transistors (abbreviated hereinafter as "TFTs") on a same substrate, and to a process for fabricating the same. The semiconductor integrated circuit according to the present invention is utilized, for example, in active matrices of liquid crystal displays.

2. Prior Art

Prior art TFTs have been fabricated heretofore by patterning a thin film semiconductor region (active layer) into an island-like shape to isolate the region from other TFTs, depositing an insulating film as a gate dielectric on the region by CVD or sputtering, and then forming thereon a gate electrode.

FIG. 2 shows the process for fabricating a semiconductor integrated circuit comprising a TFT according to a prior art process. Referring to FIG. 2, a base film 22 and a silicon film 23 are formed on a substrate 21. Then, films 24a and 24b made of a material such as a photoresist are formed selectively on the silicon film 23. A thin film of silicon oxide or silicon nitride can be formed between the silicon film 23 and the films 24a and 24b to prevent the silicon film from being polluted (FIG. 2 (A)).

The silicon film 23 is etched thereafter to form island-like silicon regions (active layers) 25a and 25b using the films 24a and 24b as the masks, however, the base layer 22 is etched partially at the same time. Thus, the step height increases by the over-etched portion x in addition to the thickness of the silicon film (FIG. 2 (B)).

Then, an insulating film 26 which functions as a gate dielectric is formed over the entire surface to form a gate electrode with lines 27n, 27p, and 27c. Line disconnection may occur in case the active layer is provided with too large a step height.

After forming the gate electrode, impurities are introduced by means of, for example, ion doping or ion implantation. The resulting structure thus obtained is subjected to activation treatment by, for example, thermal annealing, laser annealing, or lamp annealing to form impurity regions 28n (n-type) and 28p (p-type).

Subsequently, an interlayer insulator 29 is deposited to form contact holes therethrough, and electrodes 30a, 30b, and 30c are formed in the impurity regions of the TFT.

In the prior art processes, however, the overetching of the base film has been found a problem. The presence of a step due to the overetching causes disconnection on the gate electrode to considerably impair the product yield. A step with a further increased step height produces in particular when a film having a high etching rate is used as the base film. Accordingly, though the use of a film deposited by plasma CVD or APCVD is preferred as the base film from the mass productivity point of view, these types of films are not preferred from the aforementioned problem of high etching rate. Thus, an object of the present invention is to review the problems in the prior art process for element isolation, and to provide a TFT of high product yield and a process for fabricating the same.

SUMMARY OF THE INVENTION

The present invention comprises electrically isolating the elements (e.g. the transistors) from each other not by cutting the silicon film but by selectively and thermally oxidizing the silicon film in the temperature range of from 500 to 650° C. The silicon film to be oxidized may be either an amorphous film or a crystalline film. The silicon film is provided at a thickness of from 100 to 1,500 Å, and more preferably, at a thickness of 500 Å or less. A glass substrate having a thermal deformation point (strain point) of 750° C. or lower, which is represented by a Corning 7059 glass (an alkali-free borosilicate glass), is used as the substrate.

What is to be noted here is that a non-single crystal silicon, for example, an amorphous or a polycrystalline silicon, yields a thermal oxidation rate which is about twice as large as that of a single crystal silicon. In the present invention, furthermore, from 0.1 to 100% of water is added into the atmosphere to increase the oxidation rate. The addition of water increases the oxidation rate by about 10 times as compared with that in a dry atmosphere. FIG. 5 shows the relation between the thickness of silicon oxide obtained by the oxidation process (under a water vapor partial pressure of 100%) according to the present invention and the duration of process. The figure reads that the silicon film according to the present invention can be entirely oxidized at a temperature as low as in the range of from 550 to 600° C.

The oxidation reaction can be furthermore accelerated by effecting the oxidation while applying a pressure in the range of from 1 to 15 atm. For instance, an oxidation rate 10 times the rate of oxidation under a pressure of 1 atm can be obtained under a pressure as high as 10 atm. The temperature of oxidation can be also lowered. The change in oxidation rate under a pressure of 4 atm is also shown in FIG. 5. The quantity of water vapor can be stabilized by performing the so-called pyrogenic oxidation process. This process comprises generating water vapor by the combustion of pure hydrogen. The concentration of water vapor in the atmosphere can be determined by controlling the flow rate of hydrogen.

The silicon film can be selectively oxidized by selectively forming on the silicon film a mask film comprising a silicon nitride layer or multilayered structure comprising a silicon oxide layer and a silicon nitride layer provided on the silicon oxide layer, and exposing the silicon film to a thermally oxidizing atmosphere using the mask film. No oxidation reaction proceeds on the surface thus covered with the mask.

Thus, as mentioned in the Foregoing, the process according to the present invention comprises forming the oxide by thermal oxidation. Accordingly, no steps as those generated during the etching of conventional silicon films are found to form during the process according to the present invention. Thus, disconnection of gate electrodes is prevented from occurring, and the yield is therefore increased. In particular, the process according to the present invention is almost free from the influence of the base film. Accordingly, the total mass production can be improved without being limited by the film deposition process.

EXAMPLE 1

Figure 1A:
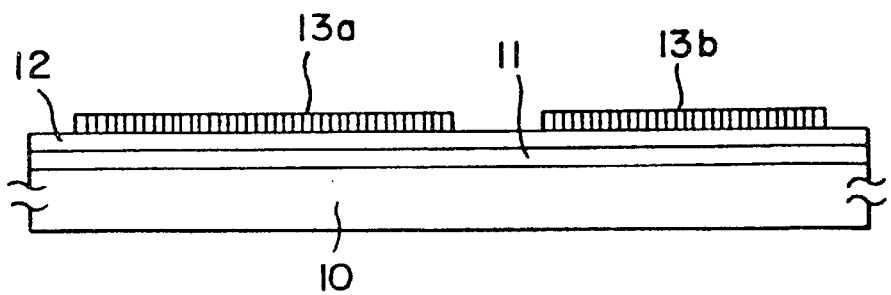
FIGS. 1 (A) to 1 (E) show the step-sequential schematically drawn views for the structures obtained during fabrication of a TFT according to Example 1 of the process of the present invention.
Figure 1B:
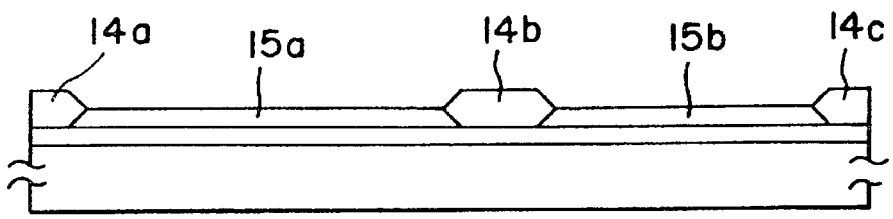
Figure 1C:
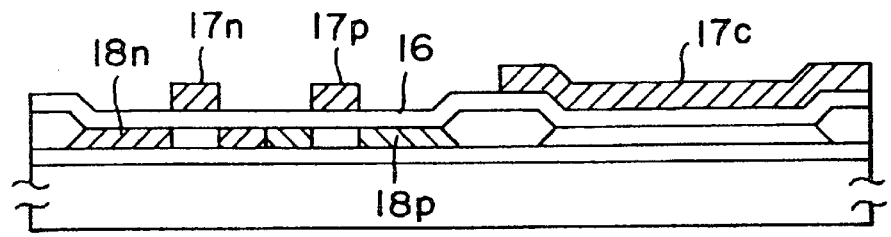
Figure 1D:
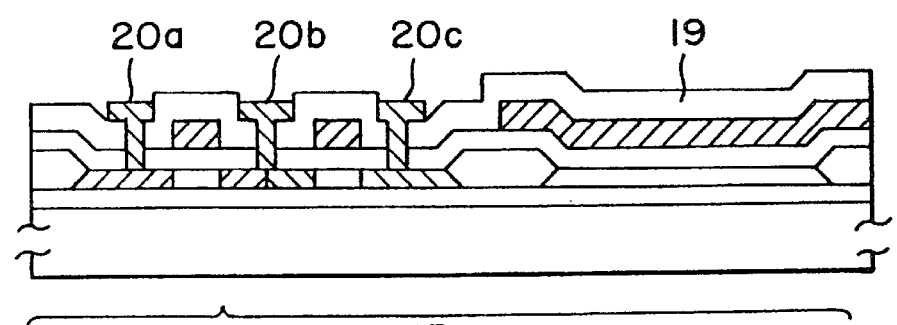
Figure 1E:
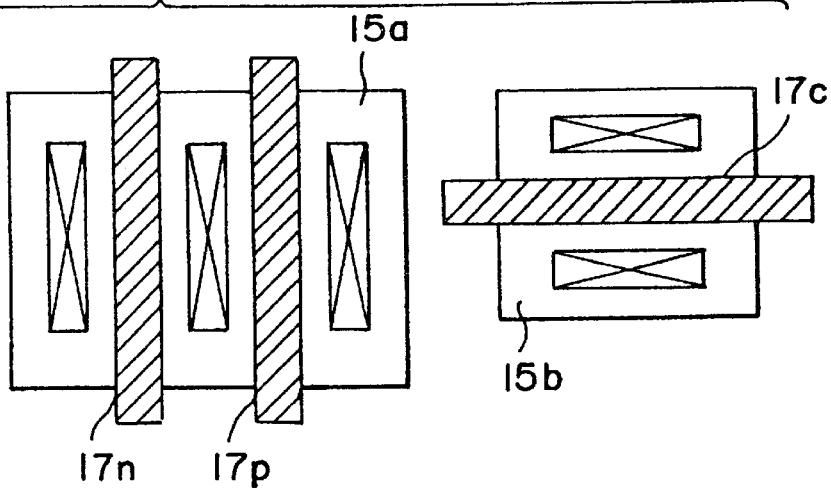
Figure 2A:
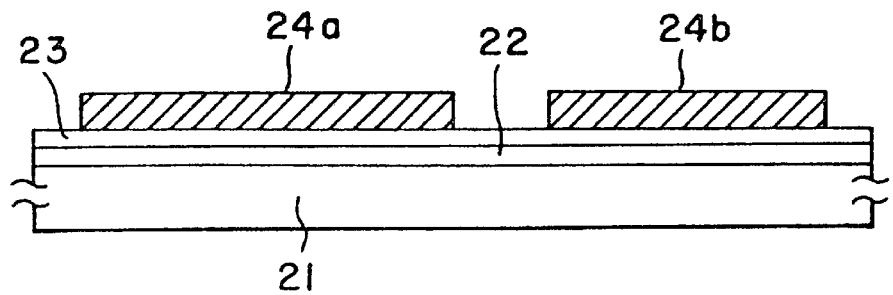
FIGS. 2 (A) to 2 (D) show the step-sequential schematically drawn views of the structures obtained during fabrication of a TFT according to a prior art process.
Figure 2B:
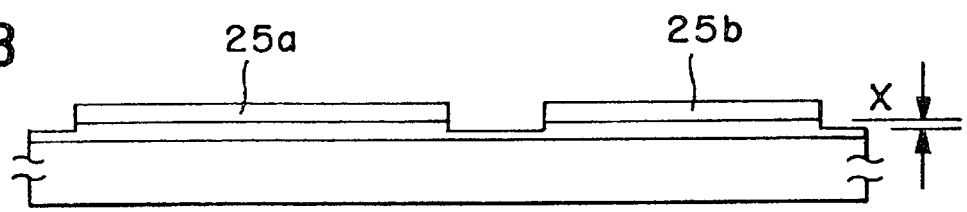
Figure 2C:
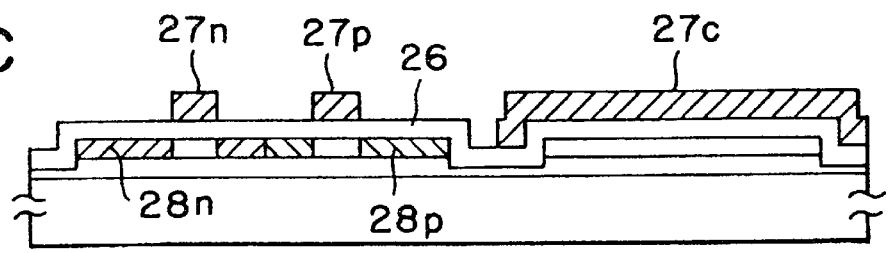
Figure 2D:
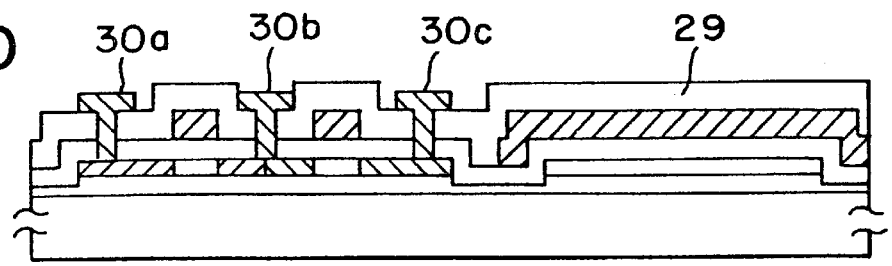

Referring to FIGS. 1 (A) to 1 (E), the process according to the present Example is described below. FIGS. 1 (A) to 1 (D) show the cross section structures, and FIG. 1 (E) shows the top view.

A Corning 7059 glass substrate 10 was heated to a temperature range higher than the deformation point thereof. Thus, the substrate was annealed in the temperature range of from 600 to 660° C., e.g., at 640° C., for a duration of from 1 to 4 hours, e.g., for 1 hour, and was gradually cooled at a rate of from 0.1 to 0.5° C./min, for example, at a rate of 0.2° C./min. The substrate was taken out from the heating chamber in the temperature range of from 450 to 590° C., more specifically, at 550° C. The substrate is preferably taken out at a temperature not higher than the maximum temperature of the subsequent heat treatment steps. This heat treatment suppresses irreversible shrinking from occurring on the substrate in the later heat treatment steps.

The substrate 10 thus subjected to the treatment above was cleaned, and a 2,000 Å thick silicon oxide film was deposited as a base film 11 by means of sputtering. An intrinsic (I-type) amorphous silicon film (intrinsic non-single crystal silicon film) 12 was deposited on the substrate at a thickness of from 300 to 1,000 Å, for example, at a thickness of 500 Å, by effecting plasma CVD. A silicon nitride film from 500 to 2,000 Å in thickness, for instance at a thickness of 1,000 Å, was deposited continuously. The silicon nitride film thus obtained only was selectively etched to form mask films 13a and 13b (FIG. 1 (A)).

The silicon film was then annealed at 600° C. for a duration of 48 hours under a nitrogen gas atmosphere of 1 atm to crystallize the silicon film. The crystallized silicon film was then allowed to stand in an oxygen atmosphere (oxidizing atmosphere) containing 10% water vapor under a pressure of 1 atm while maintaining the temperature in the range of from 550 to 650° C., representatively, at 600° C., for a duration of from 3 to 5 hours. Thus, the region of the silicon film not covered by the mask film was completely oxidized to the bottom to form silicon oxide regions 14a to 14c. The pressure of the water vapor was controlled by pyrogenic oxidation. As a result, the silicon film was separated into regions 15a and 15b (FIG. 1 (B)).

The masks 13a and 13b were removed thereafter, and a 1,200 Å thick silicon oxide insulating film 16 was deposited on the silicon film by plasma CVD to provide a gate dielectric (gate insulating film) using tetraethoxysilane (Si(OC$_2$H$_5$)$_4$; TEOS) and oxygen as the starting materials. Subsequently, a silicon film containing from 0.01 to 0.2% phosphorus was deposited by means of LPCVD at a thickness of from about 3,000 to 8,000 Å, for example, at a thickness of 6,000 Å. The silicon film was patterned to form gate electrodes 17n, 17p, and 17c on the gate insulating film.

Impurities for imparting the region either P- or N-conductive were introduced in a self-aligned manner by means of ion doping process (plasma doping process) into the isolated silicon regions constituting the source/drain and the channel using the gate electrodes as the mask. Phosphine (PH$_3$) and diborane (B$_2$H$_6$) were used as the doping gas. The dose was from $1\times10^{15}$ to $8\times10^{15}$ cm$^{-2}$. Thus, in case phosphine was used, phosphorus was introduced at a dose of, more specifically, $2\times10^{15}$ cm$^{-2}$, while applying an accelerating voltage of from 60 to 90 kV, for example, a voltage of 80 kV. In case diborane was used, boron was introduced at a dose of $5\times10^{15}$ cm$^{-2}$ while applying an accelerating voltage of from 40 to 80 kV, for instance, a voltage of 65 kV. The regions were each selectively doped with the element by covering the other region with a photoresist. Thus were obtained an N-type impurity region 18n and a P-type impurity region 18p to form a region for a P-channel TFT (PTFT) and region for an N-channel TFT (NTFT). The outer periphery of the active layer of each of the PTFT and the NTFT is oxidized to the bottom as described above.

The region was then annealed by irradiating a laser beam. A KrF excimer laser operating at a wavelength of 248 nm and at a pulse width of 20 nsec was used in the present invention. However, the type of the laser is not only limited thereto, and any other type of laser can be used as well. The laser beam was irradiated from 2 to 10 shots per site, for example, 2 shots per site, at an energy density of from 200 to 400 mJ/cm$^2$, for instance, at 250 mJ/cm$^2$. The effect of laser annealing can be further enhanced by heating the substrate in the temperature range of from about 200 to 450° C. (FIG. 1 (C)).

A 6,000 Å thick silicon oxide film 19 was deposited by plasma CVD process thereafter as an interlayer dielectric. The interlayer dielectric may be made from a polyimide film or a double-layered film of silicon oxide and polyimide. Contact holes were formed thereafter to establish electrodes with wiring 20a, 20b, and 20c for the TFT using a metallic material, for example, a multilayered film of titanium nitride and aluminum. A semiconductor circuit comprising the TFTs in a complementary arrangement was obtained by finally annealing the structure at a temperature of 350° C. for a duration of 30 minutes under a hydrogen gas atmosphere at a pressure of 1 atm (FIG. 1 (D)).

The plan view of the structure shown with a cross section structure in FIG. 1 (C) is given in FIG. 1 (E). The cross section structures seen along the dot-and-dash line in FIG. 1 (E) are given in FIGS. 1 (A) to 1 (D).

EXAMPLE 2

Figure 3A:
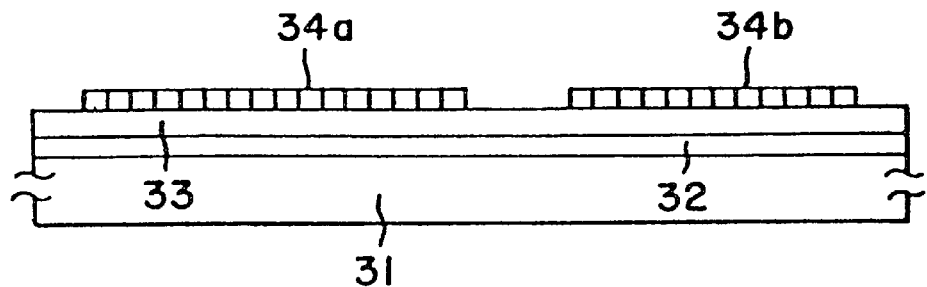
FIGS. 3 (A) to 3 (E) show the step-sequential schematically drawn views for the structures obtained during fabrication of a TFT according to Example 2 of the process of the present invention.
Figure 3B:
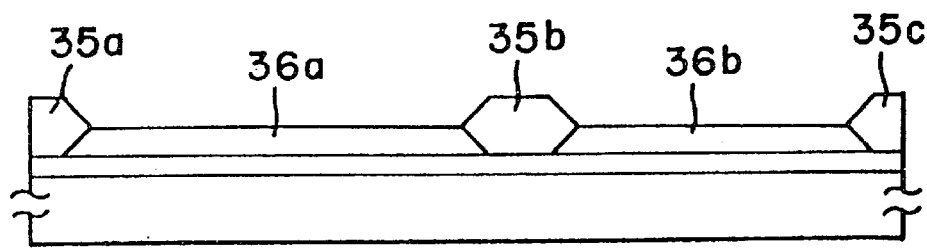
Figure 3C:
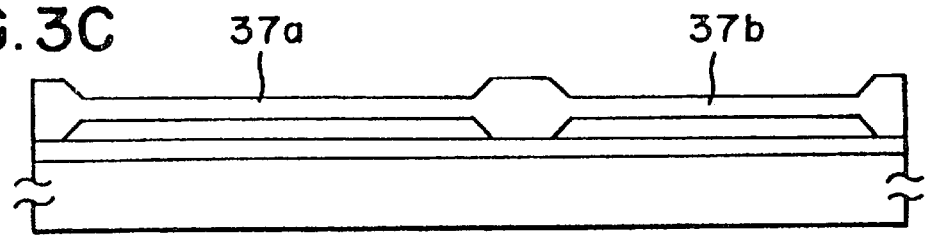
Figure 3D:
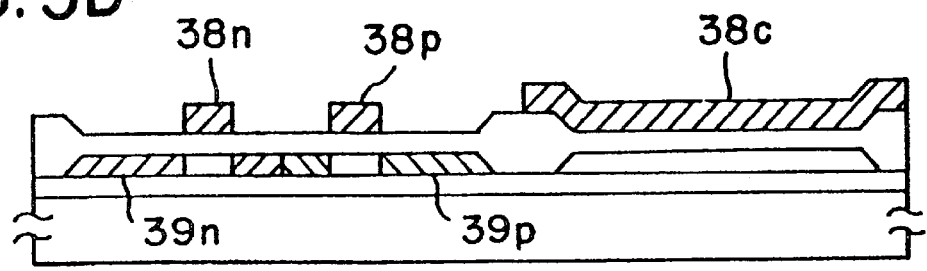
Figure 3E:
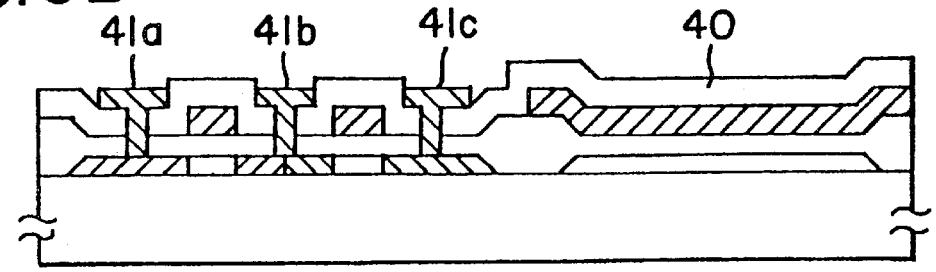

FIGS. 3 (A) to 3 (E) show the process for fabricating a TFT according to the present Example.

A Corning 7059 glass substrate 31 having a deformation point of 593° C. was heated to a temperature range higher than the deformation point thereof. Thus, the substrate was annealed in the temperature range of from 600 to 660° C., e.g., at 640° C., for a duration of from 1 to 4 hours, e.g., for 1 hour, and was gradually cooled at a rate of from 0.1 to 0.5° C./min, for example, at a rate of 0.2° C./min. The substrate was taken out from the heating chamber in the temperature range of from 450 to 590° C., more specifically, at 550° C.

The substrate 31 thus subjected to the treatment above was cleaned, and a 2,000 Å thick silicon oxide film was deposited as a base film 32 by means of sputtering. An intrinsic (I-type) amorphous silicon film 33 was deposited at a thickness of from 300 to 1,000 Å, for example, at a thickness of 1,000 Å, by effecting plasma CVD. A silicon nitride film from 500 to 2,000 Å in thickness, for instance, at a thickness of 1,000 Å, was deposited continuously. The silicon nitride film thus obtained only was selectively etched to form mask films 34a and 34b (FIG. 3 (A)).

The silicon film was then annealed at 600° C. for a duration of 48 hours under a nitrogen gas atmosphere of 1 atm to crystallize the silicon film. The crystallized silicon film was then allowed to stand in a 100% by volume water vapor atmosphere under a pressure of 10 atm while maintaining the temperature in the range of from 500 to 600° C., representatively, at 550° C., for a duration of from 3 to 5 hours. Thus, the region of the silicon film not covered by the mask film was completely oxidized to the bottom to form silicon oxide regions 35a to 35c. The silicon region was divided in this manner into regions 36a and 36b (FIG. 3 (B)).

The masks 34a and 34b were removed thereafter, and the surface was globally oxidized again by exposing the resulting structure to an atmosphere containing 100% water vapor for a duration of from 3 to 5 hours at a temperature of from 500 to 600° C., representatively, at 550° C. The surface of the silicon regions 36a and 36b was oxidized in this step to form about 1,000 Å thick oxide films 37a and 37b. The thickness of the silicon region was found to be about 500 Å after this step. The substrate was then left under a nitrous oxide ($N_2O$) atmosphere at 600° C. after the oxidation step to provide thermally oxidized films 37a and 37b as the gate dielectric (FIG. 3 (C)).

A silicon film containing from 0.01 to 0.2% phosphorus was deposited at a thickness of from 3,000 to 8,000 Å, for example, at a thickness of 6,000 Å, by LPCVD. The silicon film was patterned to form gate electrodes 38n, 38p, and 38c.

Impurities for imparting the region either P- or N-conductive were introduced in a self-aligned manner by means of ion doping process (plasma doping process) into the isolated silicon regions constituting the source/drain and the channel using the gate electrodes as the mask. Phosphine ($PH_3$) and diborane ($B_2H_6$) were used as the doping gas. The dose was from $1\times10^{15}$ to $8\times10^{15}$ cm$^{-2}$. Thus, in case phosphine was used, phosphorus was introduced at a dose of, more specifically, $2\times10^{15}$ cm$^{-2}$, while applying an accelerating voltage of from 60 to 90 kV, for example, a voltage of 80 kV. In case diborane was used, boron was introduced at a dose of $5\times10^{15}$ cm$^{-2}$ while applying an accelerating voltage of from 40 to 80 kV, for instance, a voltage of 65 kV. The regions were each selectively doped with the element by covering the other region with a photoresist. Thus were obtained an N-type impurity region 39n and a P-type impurity region 39p to form a region for a P-channel TFT (PTFT) and a region for an N-channel TFT (NTFT).

The regions were then annealed by irradiating a laser beam. A KrF excimer laser operating at a wavelength of 248 nm and at a pulse width of 20 nsec was used in the present invention. However, the type of the laser is not only limited thereto, and any other type of laser can be used as well. The laser beam was irradiated from 2 to 10 shots per site, for example, 2 shots per site, at an energy density of from 200 to 400 mJ/cm$^2$, for instance, at 250 mJ/cm$^2$.

The effect of laser annealing can be further enhanced by heating the substrate in the temperature range of from about 200 to 450° C. (FIG. 3 (D)).

A 6,000 Å thick silicon oxide film 40 was deposited by plasma CVD process thereafter as an interlayer dielectric. The interlayer dielectric may be made from a polyimide film or a double-layered film of silicon oxide and polyimide. Contact holes were formed thereafter to establish electrodes with wiring 41a, 41b, and 41c for the TFT using a metallic material, for example, a multilayered film of titanium nitride and aluminum. A semiconductor circuit comprising the TFTs in a complementary arrangement was obtained by finally annealing the structure at a temperature of 350° C. for a duration of 30 minutes under a hydrogen gas atmosphere at a pressure of 1 atm (FIG. 3 (E)).

EXAMPLE 3

Figure 4A:
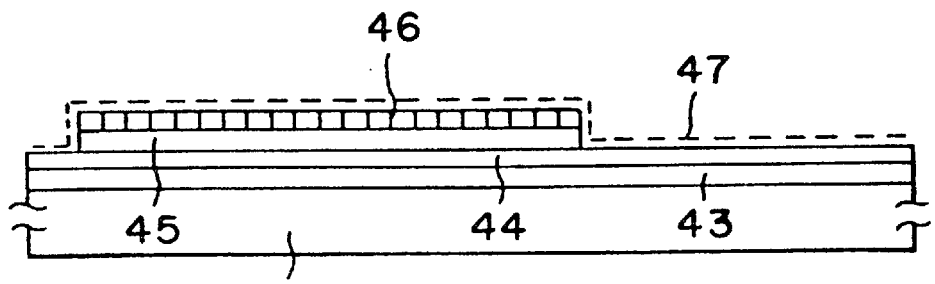
FIGS. 4 (A) to 4 (E) show the step-sequential schematically drawn views for the structures obtained during fabrication of a TFT according to Example 3 of the process of the present invention.
Figure 4B:
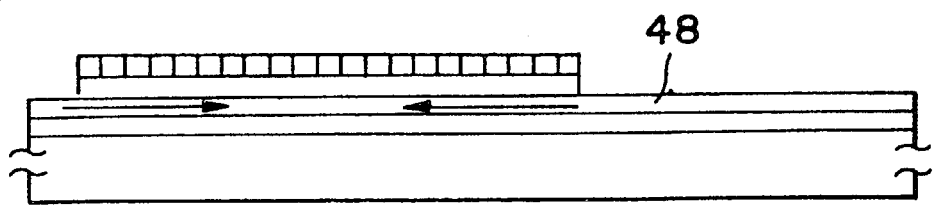
Figure 4C:
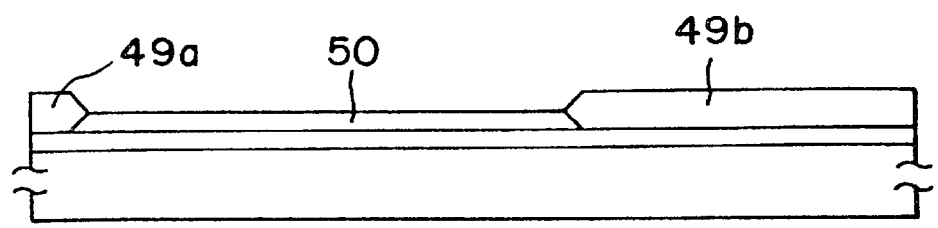
Figure 4D:
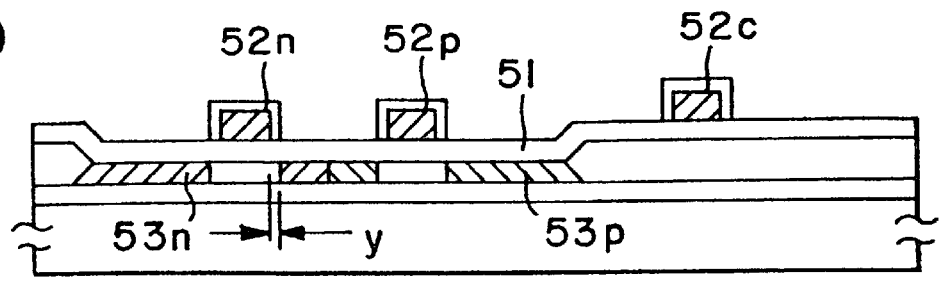
Figure 4E:
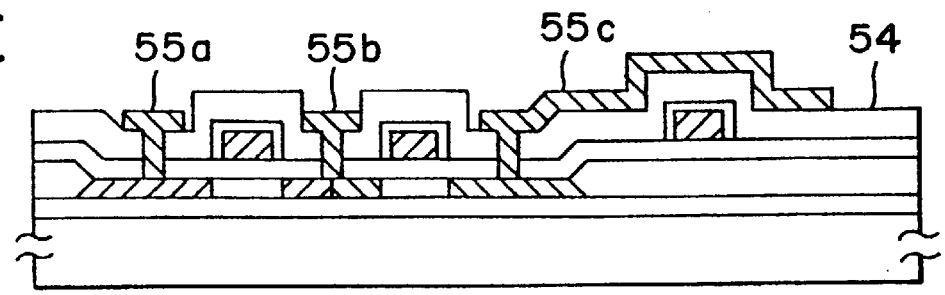
Figure 5:
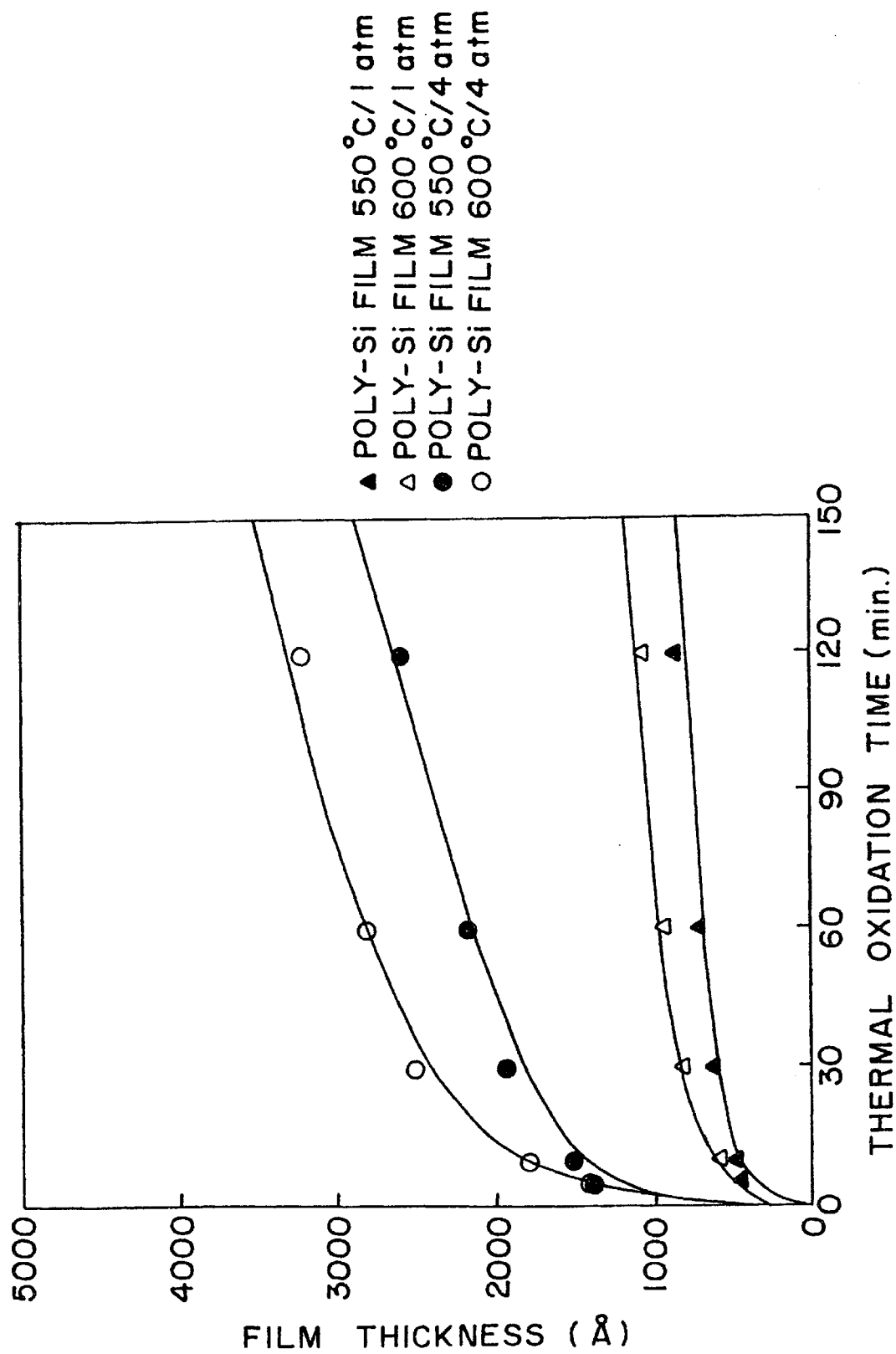
FIG. 5 is a graph showing the progress of thermal oxidation on a polycrystalline silicon film at a low temperature of 600° C. or lower under the presence of water vapor.

FIGS. 4 (A) to 4 (E) show the process for fabricating a TFT according to the present Example.

A Corning 7059 glass substrate 42 having a deformation point of 593° C. was heated to a temperature range higher than the deformation point thereof. Thus, the substrate was annealed in the temperature range of from 600 to 660° C., e.g., at 640° C., for a duration of from 1 to 4 hours, e.g., for 1 hour, and was gradually cooled at a rate of from 0.1 to 0.5° C./min, for example, at a rate of 0.2° C./min. The substrate was taken out from the heating chamber in the temperature range of from 450 to 590° C., more specifically, at 550° C. The substrate 42 thus subjected to the treatment above was cleaned, and a 2,000 Å thick silicon oxide film was deposited as a base film 43 by means of plasma CVD using TEOS as the starting material. An intrinsic (I-type) amorphous silicon film (intrinsic non-single crystal silicon film) 44 was deposited at a thickness of from 100 to 1,000 Å, for example, at a thickness of 300 Å, by effecting plasma CVD. A silicon oxide film 45 having a thickness of 1,000 Å and a silicon nitride film 46 having a thickness of 1,000 Å were deposited continuously. The layers thus obtained were patterned to form a mask.

A thin nickel film from 5 to 20 Å in thickness, for example, 10 Å in thickness, was formed by sputtering. Because this film is extremely thin, it may not be said a film in the strict sense. Thus, the film thickness is an average value. Preferably, the substrate is heated in the range of from 150 to 300° C. during the film deposition. The nickel introduced during this step exerts a catalytic effect on the crystallization of the amorphous silicon layer (FIG. 4 (A)).

The amorphous silicon layer was thermally annealed thereafter at 600° C. for 4 hours in a nitrogen atmosphere under a pressure of 1 atm. The nickel film was found to undergo crystal growth from the selective region on which it was deposited to the region covered with the mask film along the transverse direction (i.e., the direction in parallel with the substrate). As a result, the amorphous silicon film was crystallized to form a crystalline silicon film 48 (FIG. 4 (B)).

The crystallized silicon film was then allowed to stand in a 100% by volume water vapor atmosphere under a pressure of 10 atm while maintaining the temperature in the range of from 500 to 600° C., representatively, at 550° C., for a duration of 1 hour. Thus, the region of the silicon film not covered by the mask film was completely oxidized to the bottom to form silicon oxide regions 49a and 49b in contact with the side (side plane) of the active layer of the TFT (FIG. 4 (C)).

A silicon oxide film 51 was deposited at a thickness of 1,200 Å by plasma CVD to provide a gate dielectric. Subsequently, an aluminum film containing from 0.01 to 0.2% of scandium was deposited by sputtering to a thickness of from 6,000 to 8,000 Å, specifically at 6,000 Å, and was patterned to form gate electrodes. The surface of the gate electrodes was covered with an anodic oxide layer by anodically oxidizing the surface thereof. The anodic oxidation was effected in an ethylene glycol solution containing from 1 to 5% tartaric acid. The oxide layer thus obtained was 2,000 Å in thickness. Since the oxide layer can be formed to such a thickness capable of forming an offset gate region, the length of the offset gate region can be determined by the anodic oxidation step. Thus were obtained the gate electrode portion 52$n$, 52$p$, and 52$c$ inclusive of gate electrode and the peripheral anodic oxide layer.

Impurities for rendering the crystalline silicon region 50 either N-type or P-type conductive were introduced in a self-aligned manner by ion doping using the gate electrode portion as the mask. Phosphine ($PH_3$) and diborane ($B_2H_6$) were used as the doping gas. The dose was from $1 \times 10^{15}$ to $8 \times 10^{15}$ $cm^{-2}$. Thus, in case phosphine was used, phosphorus was introduced at a dose of, more specifically, $2 \times 10^{15}$ $cm^{-2}$, while applying an accelerating voltage of from 60 to 90 kV, for example, a voltage of 80 kV. In case diborane was used, boron was introduced at a dose of $5 \times 10^{15}$ $cm^{-2}$ while applying an accelerating voltage of from 40 to 80 kV, for instance, a voltage of 65 kV. The regions were each selectively doped with the element by covering the other region with a photoresist. Thus were obtained an N-type impurity region 53$n$ and a P-type impurity region 53$p$ to form a region for a P-channel TFT (PTFT) and a region for an N-channel TFT (NTFT).

The regions were then annealed by irradiating a laser beam. A KrF excimer laser operating at a wavelength of 248 nm and at a pulse width of 20 nsec was used in the present invention. However, the type of the laser is not only limited thereto, and any other type of laser can be used as well. The laser beam was irradiated from 2 to 10 shots per site, for example, 2 shots per site, at an energy density of from 200 to 400 $mJ/cm^2$, for instance, at 250 $mJ/cm^2$. The effect of laser annealing can be further enhanced by heating the substrate in the temperature range of from about 200 to 450° C. As mentioned in the foregoing, the gate electrode is offset by a length y corresponding to the thickness of the anodic oxide layer from the impurity region (FIG. 4 (D)).

A 6,000 Å thick silicon oxide film 54 was deposited by plasma CVD process thereafter as an interlayer dielectric. Contact holes were formed thereafter to establish electrodes with wiring 55$a$, 55$b$, and 55$c$ for the TFT using a metallic material, for example, a multilayered film of titanium nitride and aluminum. A semiconductor circuit comprising the TFTs in a complementary arrangement was obtained by finally annealing the structure at a temperature of 350° C. for a duration of 30 minutes under a hydrogen gas atmosphere at a pressure of 1 atm (FIG. 4 (E)).

EXAMPLE 4

Figure 6A:
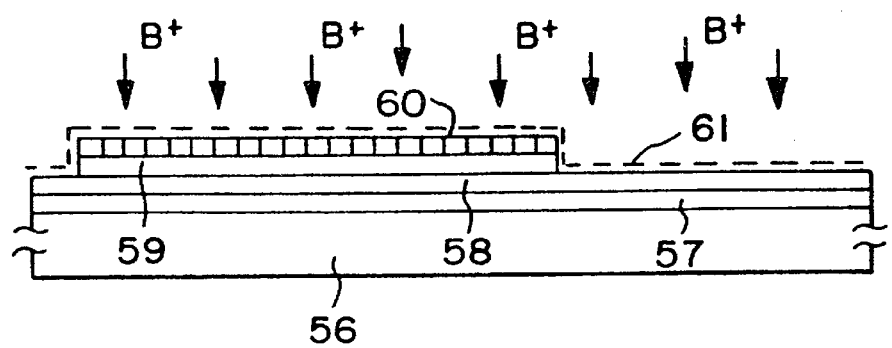
FIGS. 6 (A) to 6 (E) show the step-sequential schematically drawn views for the structures obtained during fabrication of a TFT according to Example 4 of the process of the present invention.
Figure 6B:
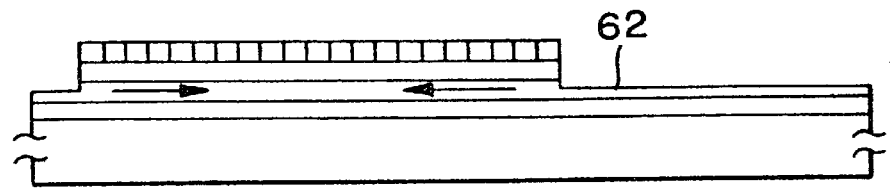
Figure 6C:
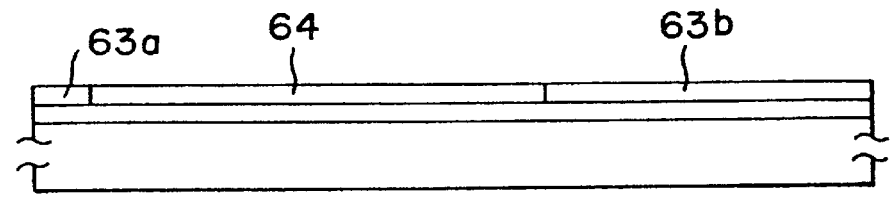
Figure 6D:
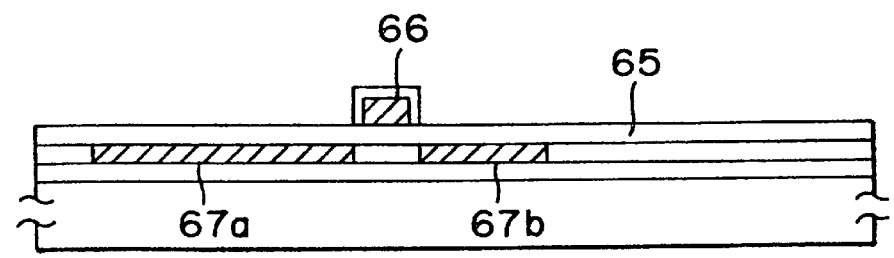
Figure 6E:
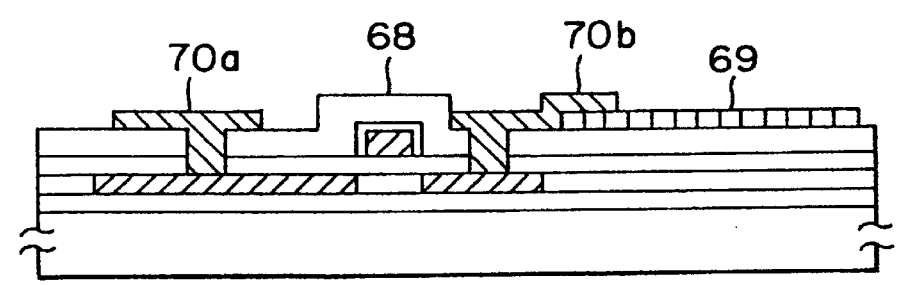

FIGS. 6 (A) to 6 (E) show the process for fabricating a TFT-type active matrix circuit for use in liquid crystal displays according to the present Example.

A Corning 7059 glass substrate 56 having an insulating surface and a deformation point of 593° C. was heated to a temperature range higher than the deformation point thereof. Thus, the substrate was annealed in the temperature range of from 600 to 660° C., e.g., at 640° C., for a duration of from 1 to 4 hours, e.g., for 1 hour, and was gradually cooled at a rate of from 0.1 to 0.5° C./min, for example, at a rate of 0.2° C./min. The substrate was taken out from the heating chamber in the temperature range of from 450 to 590° C., more specifically, at 550° C. The substrate 56 thus subjected to the treatment above was cleaned, and a 2,000 Å thick silicon oxide film was deposited as a base film 57 by means of plasma CVD using TEOS as the starting material. An intrinsic (I-type) amorphous silicon film (intrinsic non-single crystal silicon film) 58 was deposited by plasma CVD at a thickness of from 100 to 1,000 Å, for example, at a thickness of 800 Å. A silicon oxide film 59 having a thickness of 1,000 Å and a silicon nitride film 60 having a thickness of 1,000 Å were deposited continuously. The layers thus obtained were patterned to form a mask.

A thin nickel film from 5 to 20 Å in thickness, for example, 10 Å in thickness, was formed by sputtering. Because this film is extremely thin, it may not be said a film in a strict sense. Thus, the film thickness in this case is an average value. Preferably, the substrate is heated in the range of from 150 to 300° C. during the film deposition. The nickel introduced during this step exerts a catalytic effect on the crystallization of the amorphous silicon layer. Boron ions were introduced thereafter into the silicon film 58 at a dose of from $2 \times 10^{13}$ to $5 \times 10^{15}$ $cm^{-2}$, for example, at a dose of $5 \times 10^{15}$ $cm^{-2}$ using the mask film 60 as a mask. The boron ions prevents current leak from occurring due to the formation of an N-type layer on the boundary of the silicon oxide. That is, the boron ions function as the so-called channel stoppers which more clearly isolate the TFTs (FIG. 6 (A)).

The amorphous silicon layer was thermally annealed thereafter at 600° C. for 4 hours in a nitrogen atmosphere under a pressure of 1 atm. The nickel film was found to undergo crystal growth from the selective region on which it was deposited to the region covered with the mask film along the transverse direction (i.e., the direction in parallel with the substrate). After the crystallization, the silicon layer was etched using the mask film 60 as the mask to reduce the thickness thereof to a half of the initial, i.e., from 800 Å to 400 Å (FIG. 6 (B)).

The crystallized silicon film was then allowed to stand in an oxygen atmosphere containing 10% water vapor under a pressure of 10 atm while maintaining the temperature in the range of from 500 to 600° C., representatively, at 550° C., for a duration of 3 hours. Thus, the region of the thin silicon film not covered by the mask film was completely oxidized from a surface thereof through the mask film to form silicon oxide regions 63$a$ and 63$b$. The pressure of the water vapor was controlled by pyrogenic oxidation. As a result, the silicon film was converted into a silicon oxide layer having a thickness about twice that of the initial silicon layer. In this manner, a silicon oxide region 63 was formed at the same height as those of the region 64 remaining as silicon in the periphery thereof (FIG. 6 (C)).

A silicon oxide film 65 was deposited at a thickness of 1,200 Å by plasma CVD to provide a gate dielectric. Subsequently, an aluminum film containing from 0.01 to 0.2% of scandium was deposited by sputtering to a thickness of from 6,000 to 8,000 Å, specifically at 6,000 Å, and was patterned to form a gate electrode. The surface of the aluminum gate electrode was covered with an anodic oxide layer by anodically oxidizing the surface thereof. The anodic oxidation was effected in an ethylene glycol solution containing from 1 to 5% tartaric acid. The oxide layer thus obtained was 2,000 Å in thickness. Since the oxide layer can be formed to such a thickness capable of forming an offset gate region, the length of the offset gate region can be determined by the anodic oxidation step. Thus was obtained a gate electrode portion 66 inclusive of gate electrode and the peripheral anodic oxide layer. Since the silicon region 64 and the silicon oxide region 63 were formed at approximately the same height, no failures such as disconnection were found to occur on the gate electrode.

Impurities for rendering the crystalline silicon region 64 N-type conductive was introduced in a self-aligned manner by ion doping (plasma doping) using the gate electrode portion as the mask. Phosphine ($PH_3$) was used as the doping gas. The dose was from $1\times10^{15}$ to $8\times10^{15}$ $cm^{-2}$. Thus, phosphorus was introduced at a dose of, more specifically, $2\times10^{15}$ $cm^{-2}$, while applying an accelerating voltage of from 60 to 90 kV, for example, a voltage of 80 kV. Thus were obtained N-type impurity regions 67a and 67b to form a region for an N-channel TFT (NTFT).

The regions were then annealed by irradiating a laser beam. A KrF excimer laser operating at a wavelength of 248 nm and at a pulse width of 20 nsec was used in the present example. However, the type of the laser is not only limited thereto, and any other type of laser can be used as well. The laser beam was irradiated from 2 to 10 shots per site, for example, 2 shots per site, at an energy density of from 200 to 400 $mJ/cm^2$, for instance, at 250 $mJ/cm^2$. The effect of laser annealing can be further enhanced by heating the substrate in the temperature range of from about 200 to 450° C. (FIG. 6 (D)).

A 6,000 Å thick silicon oxide film 68 was deposited by plasma CVD process thereafter as an interlayer dielectric. A 800 Å thick ITO film was deposited thereafter by sputtering, and was patterned to provide a pixel electrode 69. Contact holes were formed thereafter in the interlayer dielectric to establish electrodes with wiring 70a and 70b for the TFT using a metallic material, for example, a multilayered film of titanium nitride and aluminum. A semiconductor circuit (semiconductor device) comprising the TFTs in a complementary arrangement was obtained by finally annealing the structure at a temperature of 350° C. for a duration of 30 minutes under a hydrogen gas atmosphere at a pressure of 1 atm (FIG. 6 (E)).

The product yield of the TFT was thus improved by the present invention. It can be seen that the process according to the present invention can be performed free from the limitations on the base film, and enables use of a film deposition process suitable for mass production. Thus, the present invention is of great use in the industry.

While the invention has been described in detail and with reference to specific embodiments thereof, it will be apparent to one skilled in the art that various changes and modifications can be made therein without departing from the spirit and scope thereof.

What is claimed is:

1. A method of fabricating a semiconductor device comprising the steps of:

forming an N-channel type transistor with an active layer in a non-single crystal silicon film on a substrate, and forming a thermal oxide insulating film which electrically isolates the transistor from another transistor, comprising silicon oxide and formed in contact with the side plane of the active layer of the transistor, the thermal oxide insulating film being formed by thermally oxidizing the same non-single crystal silicon film as that of said active layer wherein said thermal oxide is doped with boron.

2. The method of claim 1 wherein said active layer is provided at a thickness of 1000 Å or less.

3. The method of claim 1 wherein the substrate has a strain point of 750° C. or lower.

4. The method of claim 1 wherein said boron is doped at a dose within a range from $2\times10^{13}$ to $5\times10^{15}$ $cm^{-2}$.

5. A method of manufacturing a semiconductor device comprising the steps of:

forming a semiconductor film on an insulating surface;

forming a mask on said semiconductor film;

introducing boron into portion of said semiconductor film exposed by said mask;

oxidizing said portions of the semiconductor film throughout a thickness of said semiconductor film whereby at least two active regions are formed below said mask;

forming at least two N-channel type film transistors using said two active regions.

6. A method according to claim 5 wherein said boron is introduced by ion doping at a dose within a range from $2\times10^{13}$ to $5\times10^{15}$ $cm^{-2}$.

7. A method according to claim 5 further comprising a step of crystallizing said semiconductor film before the step of oxidizing.

8. A method of manufacturing a semiconductor device comprising the steps of:

forming a semiconductor film on an insulating surface;

forming a mask on said semiconductor film;

forming a catalyst containing layer on portions of said semiconductor film exposed by said mask;

introducing boron into said portions of said semiconductor film;

heating said semiconductor film so that said semiconductor film is crystallized wherein said catalyst promotes the crystallization of the semiconductor film;

oxidizing said portions of the semiconductor film throughout a thickness of the semiconductor film whereby at least two active regions are formed below said mask;

forming at least two N-channel type thin film transistors using said two active regions.

9. A method according to claim 8 wherein said catalyst comprises nickel.

10. A method according to claim 8 wherein said oxidizing step is carried out at 500 to 650° C.

* * * * *